(12) United States Patent
Kisaichi

(10) Patent No.: US 6,921,457 B2
(45) Date of Patent: Jul. 26, 2005

(54) SEMICONDUCTOR MANUFACTURING APPARATUS, AND POSITIONING JIG USED FOR SAME

(75) Inventor: Takashi Kisaichi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 310 days.

(21) Appl. No.: 09/899,192

(22) Filed: Jul. 6, 2001

(65) Prior Publication Data
US 2002/0005166 A1 Jan. 17, 2002

(30) Foreign Application Priority Data
Jul. 11, 2000 (JP) .................... 2000-209929

(51) Int. Cl.⁷ .............. C23F 1/00; H01L 21/306
(52) U.S. Cl. ........ 156/345.51; 118/500; 118/728; 156/345.54; 269/296; 269/302; 279/128; 361/234
(58) Field of Search .............. 156/345.51, 345.54; 269/302, 296; 118/500, 728; 361/234; 279/128

(56) References Cited

U.S. PATENT DOCUMENTS 6,073,576 A * 6/2000 Moslehi et al. .......... 118/723 E
6,165,276 A * 12/2000 Lu et al. .................. 118/728

FOREIGN PATENT DOCUMENTS

JP         05136252 A  *  6/1993  .......... H01L/21/68

* cited by examiner

Primary Examiner—P. Hassanzadel
Assistant Examiner—Maureen G. Arancibia
(74) Attorney, Agent, or Firm—Volentine Francos & Whitt, PLLC

(57) ABSTRACT

The placement of a wafer can be performed with good positional precision, and the positioning of wafer clamps during maintenance is facilitated. A tapered recess is formed in that portion of the wafer support on which a wafer is placed. When a wafer is placed in the recess, the sloped surface inside this recess comes into contact with the edge of the wafer from beneath the wafer. The wafer is supported in a specific attitude by the sloped surface inside this recess.

13 Claims, 8 Drawing Sheets

100
SEMICONDUCTOR MANUFACTURING APPARATUS, AND POSITIONING JIG USED FOR SAME

BACKGROUND OF THE INVENTION

1. Field of the Invention

The present invention relates to a semiconductor manufacturing apparatus for wafer processing, and positioning jig used for the same.

2. Description of Related Art

FIG. 6 is a cross section of the main components inside an etching chamber of a conventional etching apparatus (etcher). The hatching indicating the cross sectional plane is omitted in this drawing. FIG. 7 is a plan view illustrating the structure shown in FIG. 6, viewed from the top of a wafer 14. The cross section in FIG. 6 corresponds to a cross section along the I—I line in FIG. 7. The seat 22 shown in FIG. 6 is omitted in FIG. 7.

As shown in FIG. 6, a tapered recess 10a is formed in a flat susceptor 10. An opening 10b is formed in the middle at the bottom of this recess 10a, and an electrode 12 is provided inside this opening 10b. The upper part of the electrode 12 protrudes above the opening 10b. The upper surface of the electrode 12 is located lower than the upper surface of the susceptor 10. When the wafer 14 is placed on the electrode 12, the wafer 14 is surrounded by the surface of the recess 10a of the susceptor 10.

As shown in FIG. 7, a substantially cylindrical holder 18 is provided around the susceptor 10. A dozen or so wafer clamps 16 are disposed in-plane with this holder 18. Each of the wafer clamps 16 is fixed to the holder 18 by a wafer clamp fixing screw 20. The wafer clamps 16 protrude toward the center of the holder 18, and the distal ends thereof are bent downward in FIG. 6. As shown in FIG. 6, the holder 18 is fixed by holder fixing screws 24 to a seat 22 fixed on the inside of an etching chamber.

The above-mentioned susceptor 10 and electrode 12 are able to move up and down in FIG. 6. When the susceptor 10 and electrode 12 are moved upward in FIG. 6 in a state in which the wafer 14 has been placed on the electrode 12, the edges of the top surface of the wafer 14 come into contact with the distal ends of the wafer clamps 16. The wafer 14 is pressed from above by the wafer clamps 16, and as a result the wafer 14 is fixed to the electrode 12.

A hole 12a is formed in the center of the electrode 12, going from the top of the electrode 12 inward. The hole 12a extends up and down in FIG. 6. A wafer vertical chuck 26 is housed in this hole 12a in a state in which it is able to move in the direction in which the hole 12a extends.

The procedure for setting a wafer on the electrode will now be described through reference to FIG. 8. First, the susceptor 10 and electrode 12 are moved away from the seat 22, that is, downward in FIG. 8. The wafer 14 is conveyed by a wafer conveyance means (not shown) to the etching chamber, and brought over the electrode 12. The wafer vertical chuck 26 within the electrode 12 is then raised toward the wafer 14. The underside of the wafer 14 is vacuum chucked to the top of the wafer vertical chuck 26. After the wafer is chucked, the wafer vertical chuck 26 descends to its home position, and the wafer 14 is placed on the electrode 12. The susceptor 10 and electrode 12 are then raised until the upper surface of the wafer 14 comes into contact with the wafer clamps 16. As a result, the wafer 14 is fixed on the electrode 12.

However, when a wafer was placed on the electrode with a conventional device, because the conveyance precision of the wafer conveyance means was not very good, it was possible that the wafer would be set out of place from the specified position. If the wafer was brought into contact with the wafer clamps in this state, the pressure exerted on the wafer was uneven and the wafer would crack.

Also, the holder is removed from the seat during maintenance, and the wafer clamps must be positioned every time the holder is reinstalled. Accordingly, play is provided to the holes in which the wafer clamp fixing screws 20 are inserted (holes made in the wafer clamps 16) and to the holes in which the holder fixing screws 24 are inserted (holes made in the seat 22). In other words, the holes have diameters larger than those of the screws. This play is utilized to adjust the wafer clamps 16 so that they all come into contact at the proper location on the wafer. This adjustment is relatively difficult, though, and the wafer will still crack if there is even a little misalignment.

One object of the present invention is to provide a semiconductor manufacturing apparatus with which wafer placement can be performed with good positional precision in order to prevent wafer cracking.

A further object of the present invention is to provide a positioning jig that facilitates the positioning of the wafer clamp during maintenance.

Another object of the present invention is to provide a wafer-securing method.

SUMMARY OF THE INVENTION

According to a first aspect of the invention, there is provided a semiconductor manufacturing apparatus comprising a wafer support that has a tapered lateral side that supports an edge of a wafer from below the wafer, a stage on which the wafer is placed, wafer clamps that come into contact with the perimeter of the wafer from above the wafer.

According to a second aspect of the invention, there is provided a positioning jig, that is to be employed for positioning wafer clamps, in a semiconductor manufacturing apparatus having a wafer support that has a tapered lateral side that supports an edge of a wafer from below the wafer, wafer clamps that come into contact with the perimeter of the wafer from above the wafer, and a stage that supports the wafer on the upper surface thereof. The positioning jig comprising, a recess that fits onto the stage so as to cover same, and a lateral side that, in a state in which the recess is fitted onto the stage, comes into contact with the wafer clamps, thereby specifying the position of the wafer clamps.

According to a third aspect of the invention, there is provided a wafer-securing method, comprising: disposing a stage that has an upper surface, and on whose the upper surface a wafer is placed; and a wafer support that has a tapered lateral side that supports an edge of the wafer from below the wafer; placing the wafer on the stage and determining the position at which the wafer is to be placed by the edge of the wafer coming into contact with the lateral side; and securing the wafer by using wafer clamps that come into contact with the perimeter of the wafer from above the wafer.

BRIEF DESCRIPTION OF THE DRAWINGS

The foregoing and other objects, features and advantages of the present invention will be better understood from the following description taken in connection with the accompanying drawings in which.

DESCRIPTION OF THE PREFERRED EMBODIMENTS

Figure 1:
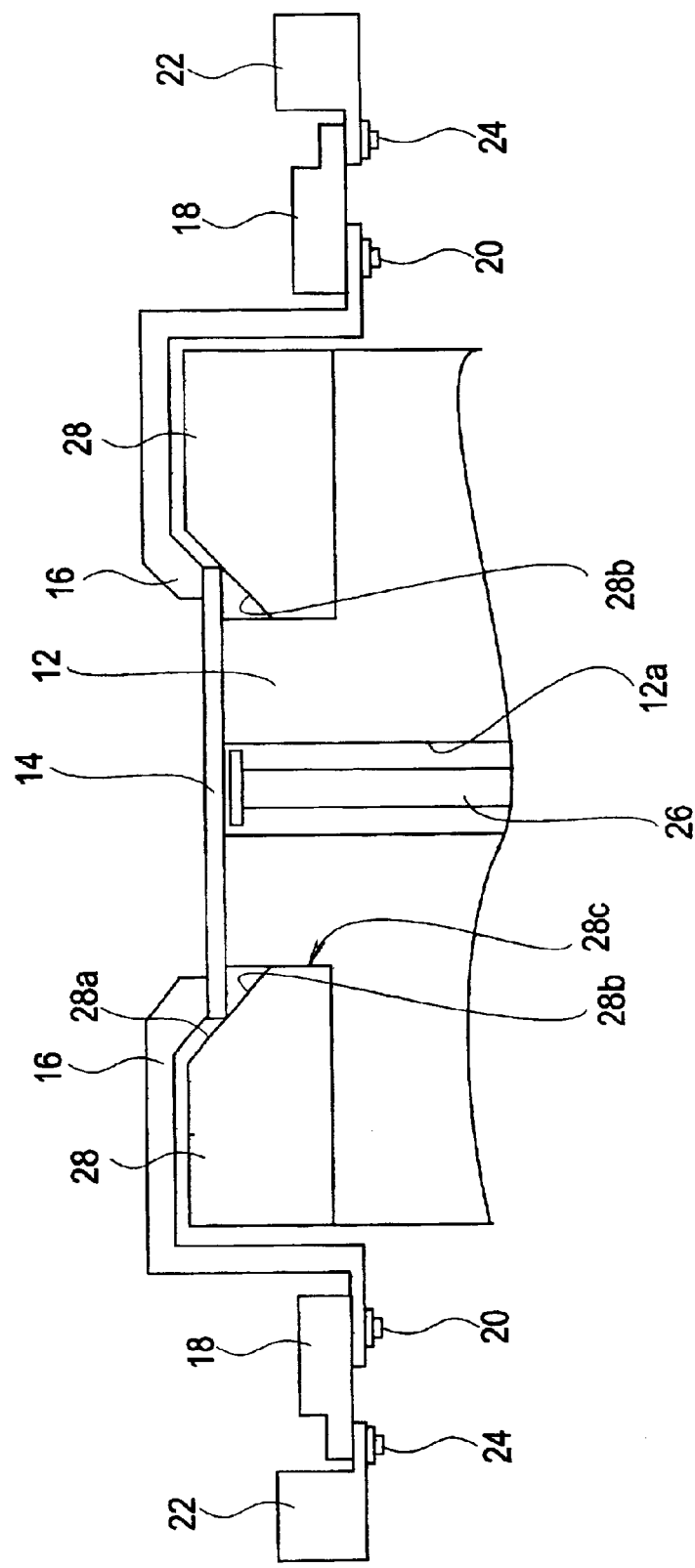
FIG. 1 is a schematic cross section of the structure inside the etching chamber in a first embodiment of the semiconductor manufacturing apparatus of this invention.

With reference to the drawings, a detailed explanation will hereinafter be given to embodiments of this invention. These drawings are merely intended to schematically illustrate the shape, size, and dispositional relationship to the extent that this invention can be understood. Accordingly, the present invention is not limited to the examples illustrated in the drawings.

With a semiconductor manufacturing apparatus that performs wafer processing, such as an etching device, a wafer support such as a susceptor is necessary to support the wafer inside a processing chamber that has been vacuum purged. As described above, in the placement of a wafer on a wafer support, the wafer must be placed in its specified position relatively precisely.

For a first embodiment, the structure of a wafer support with which wafer placement can be accomplished with good positional precision will be described. For a second embodiment, the structure of a holder and seat that facilitates the positioning of wafer clamps will be described. For third and fourth embodiments, jigs that are preferred for use in the position of wafer clamps will be described. An etching device will be used as an example in the various embodiments.

First Embodiment

Figure 2:
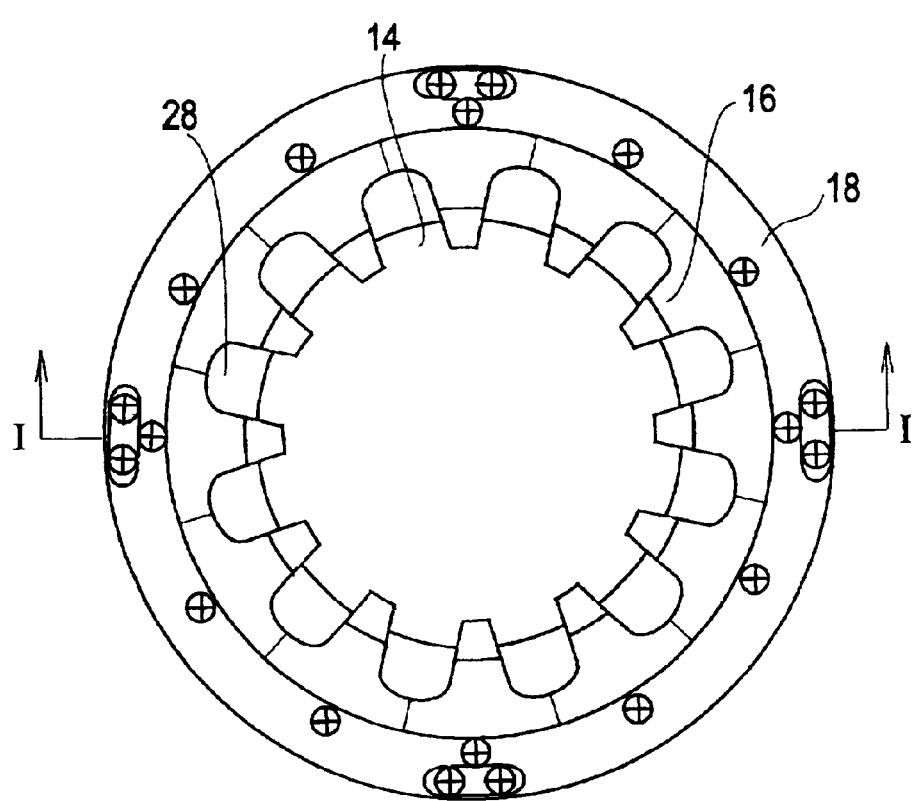
FIG. 2 is a plan view of the of the structure in the first embodiment illustrated in FIG. 1.

FIG. 1 is a cross section of the main structure inside the etching chamber in the first embodiment. The hatching indicating the cross sectional plane is omitted in this drawing. FIG. 2 is a plan view of how the structure shown in FIG. 1 looks from the top of the wafer 14. The cross section in FIG. 1 corresponds to a cross section along the I—I line in FIG. 2. The seat 22 shown in FIG. 1 is omitted in FIG. 2.

The etching device in this example is equipped with a susceptor 28 as the wafer support. A tapered recess 28a is formed in that portion of the susceptor 28 where the wafer 14 is to be placed. When the wafer 14 is placed in the recess 28a, the sloped surface 28b inside the recess 28a comes into contact with the edge of the wafer 14 from beneath the wafer 14 so that the wafer 14 is supported in a specific attitude by the sloped surface 28b inside the recess 28a.

As shown in FIG. 1, the tapered recess 28a, which spreads out upward in FIG. 1, is formed in the middle of the flat susceptor 28. An opening 28c is formed in the bottom of this recess 28a, and an electrode 12 is provided inside this opening 28c. The top part of the electrode 12 is cylindrical in shape, and this part protrudes from the top of the opening 28c. The top side of the electrode 12 is located lower than the top side of the susceptor 28.

The top side of the electrode 12 is a few centimeters smaller in size than the wafer 14. This is because if the electrode 12 is the same size as or larger than the wafer 14, then when the wafer 14 is placed on the electrode 12, the wafer 14 will stick to the electrode 12 and be difficult to remove.

In this structure example, when the wafer 14 is placed inside the recess 28a of the susceptor 28, the edge around the bottom side of the wafer 14 abuts against the sloped surface 28b that makes up the recess 28a of the susceptor 28, so that the wafer 14 is supported at just the right position. At this point, the main sides of the wafer 14 (the top and bottom sides) are parallel to the top side of the electrode 12. Also, at this point, the bottom side of the wafer 14 is preferable in contact with the top side of the electrode 12. The wafer 14 is placed such that its surrounding edge protrudes to the outside from the top side of the electrode 12.

As shown in FIG. 2, a substantially cylindrical holder 18 is provided around the susceptor 28. A dozen or so wafer clamps 16 are disposed in-plane with this holder 18. Each of the wafer clamps 16 is fixed to the holder 18 by a wafer clamp fixing screw 20. The wafer clamps 16 protrude toward the center of the holder 18, and the distal ends thereof are bent downward in FIG. 1. As shown in FIG. 1, the holder 18 is fixed by holder fixing screws 24 to a seat 22 fixed on the inside of an etching chamber. FIG. 1 does not show the screws on the inside of the holder 18, the screw holes, and so forth.

The above-mentioned susceptor 28 and electrode 12 are able to move up and down in FIG. 1. When the wafer 14 has been placed on the electrode 12 and the susceptor 28 and electrode 12 are moved upward in FIG. 1, the edge around the top surface of the wafer 14 hits the distal ends of the wafer clamps 16. The wafer 14 is then pressed by the wafer clamps 16 from above. This results in the wafer 14 being fixed on the electrode 12.

A hole 12a is formed in the center of the electrode 12, going from the top of the electrode 12 inward. The hole 12a extends up and down in FIG. 1. A wafer vertical chuck 26 is housed in this hole 12a in a state in which it is able to move in the direction in which the hole 12a extends.

The procedure for setting a wafer on the electrode will now be described. First, the susceptor 28 and electrode 12 are moved away from the seat 22, that is, downward in FIG. 1. The wafer 14 is conveyed by a wafer conveyance means (not shown) to the etching chamber, and brought over the electrode 12. The wafer vertical chuck 26 within the electrode 12 is then raised toward the wafer 14. The underside of the wafer 14 is vacuum chucked to the top of the wafer vertical chuck 26. After the wafer is chucked, the wafer vertical chuck 26 descends to its home position, and the wafer 14 is placed inside the recess 28a of the susceptor 28. The wafer 14 is supported by and rests on the sloped surface 28b inside the recess 28a. The susceptor 28 and electrode 12 are then raised until the upper surface of the wafer 14 comes into contact with the wafer clamps 16. As a result, the wafer 14 is fixed on the electrode 12.

As described above, with the above-mentioned susceptor 28, when the wafer 14 is placed inside the recess 28a, it is automatically set in the center location on the susceptor 28. In other words, the wafer 14 is always placed in the same location. Thus, if the disposition of the wafer clamps 16 has been suitably adjusted, the pressure will always be uniformly applied to the wafer 14 when the wafer clamps 16 hit the wafer 14, so there will be no cracking of the wafer.

Second Embodiment

Figure 3:
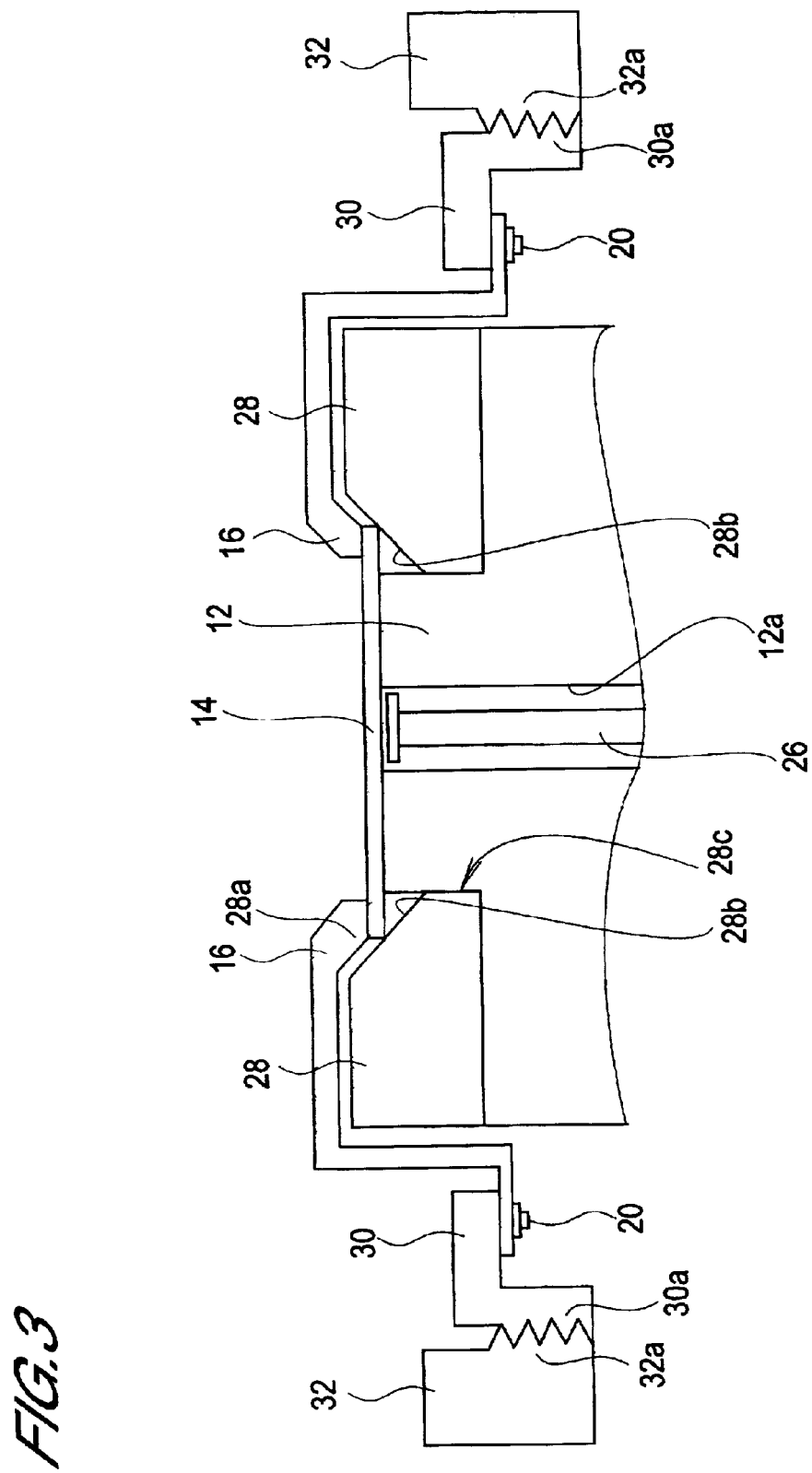
FIG. 3 is a schematic cross section of the structure inside the etching chamber in a second embodiment of the semiconductor manufacturing apparatus of this invention.

FIG. 3 is a cross section of the main structure inside the etching chamber of an etching device in a second embodiment. The hatching indicating the cross sectional plane is omitted in this drawing.

Since the structural elements other than the holder and seat shown in FIG. 3 are the same as those correspondingly shown in FIG. 1, redundant description of these structural elements will be omitted below.

The etching device in this example is equipped with a substantially cylindrical holder 30 attached to the wafer clamps 16, and a substantially cylindrical seat 32 to which this holder 30 is attached. Male threads 30a are formed around the outer lateral surface of the holder 30, and female threads 32a that mesh with these male threads 30a are formed on the inner lateral surface of the seat 32. Therefore, in the attachment of the holder 30 to the seat 32, the male threads 30a of the holder 30 are threaded into the female threads 32a of the seat 32.

Since there is thus none of the play that was provided in the conventional structure between the holder 30 and the seat 32, there is no need to position the holder 30 and the seat 32 during reassembly after maintenance. Thus, disposing the wafer clamps 16 in their proper positions is a simple matter of adjusting the positions of the wafer clamps 16 with respect to the holder 30. Therefore, with the above structure, less work is entailed by positioning the wafer clamps 16, and the positional precision thereof is also improved. In conjunction with the structure described in the first embodiment, this is also effective at preventing wafer cracking.

Third Embodiment

Figure 4A:
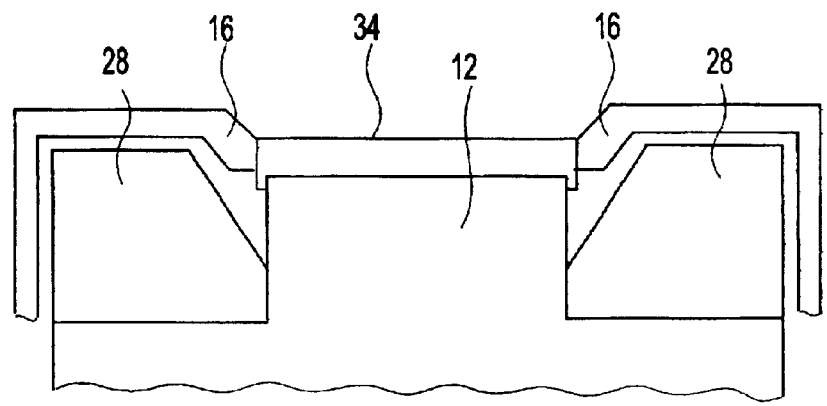
FIG. 4 (including FIGS. 4(A), 4(B), and 4(C)) is a diagram for showing the structure of a positioning jig favorable for use in the semiconductor manufacturing apparatus of this invention.
Figure 4B:
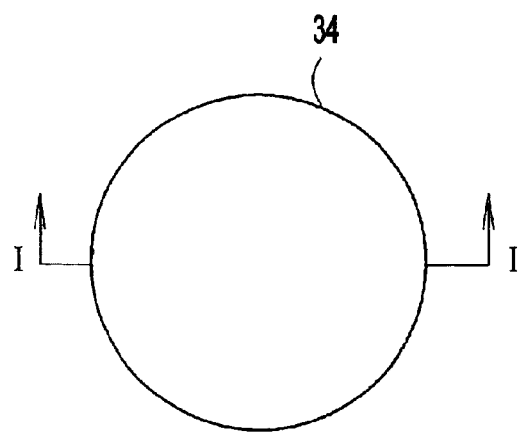
Figure 4C:
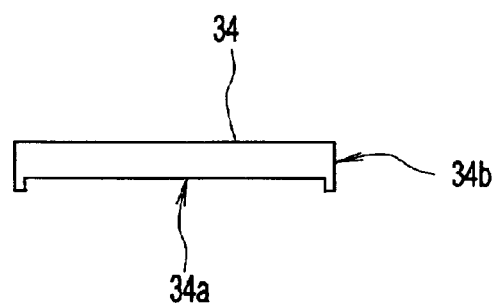

FIG. 4 consists of diagrams of a structural example of the positioning jig in a third embodiment. The hatching indicating the cross sectional plane is omitted in these drawings. FIG. 4 (A) is a cross section of the inside of an etching chamber during the use of a positioning jig. FIG. 4(B) is a plan view of the positioning jig. FIG. 4(C) is a cross section along the I—I line in FIG. 4(B). The main structure inside the etching chamber shown in FIG. 4(A) is the same as that in FIG. 1. Structural elements such as the wafer vertical chuck 26 are omitted in FIG. 4(A), however.

A positioning jig 34 is a disk-shaped member with a recess 34a formed in the center on one side. This member can be combined with the electrode (stage) 12 by fitting the top part of the electrode 12 into the recess 34a. The lateral side 34b of this member is a cylindrical side, and is parallel to the lateral side of the electrode 12 when the recess 34a is fitted onto the electrode 12. The position of the lateral side 34b at this point specifies the dispositional positions of the wafer clamps 16. As shown in FIG. 4(A), the wafer clamps 16 can be accurately and easily positioned by bringing the lateral sides of the wafer clamps 16 into contact with this lateral side 34b.

Therefore, when the holder to which the wafer clamps 16 are attached is attached to the seat, the above-mentioned positioning jig 34 is placed on the electrode 12, and the distal lateral sides of the wafer clamps 16 are brought into contact with the lateral side 34b of the positioning jig 34. The holder should be fixed to the seat in this state.

Thus, the jig in this embodiment allows the wafer clamps to be positioned in the main plane direction of the wafer. This jig allows the wafer clamps to be positioned easily and accurately, and cracking of the wafer can therefore be prevented.

Fourth Embodiment

Figure 5A:
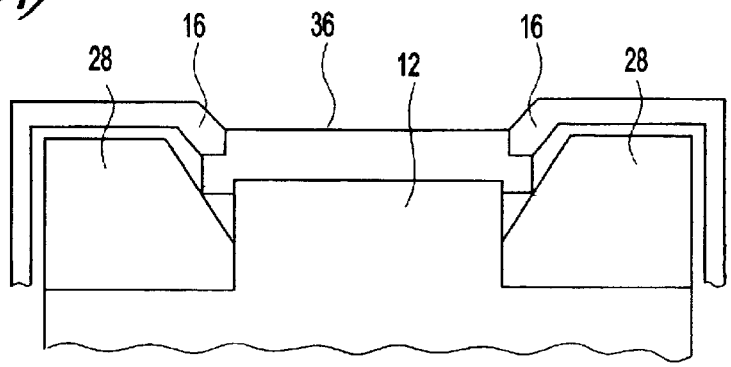
FIG. 5 (including FIGS. 5(A), 5(B), and 5(C)) is a diagram for showing the structure of another positioning jig favorable for use in the semiconductor manufacturing apparatus of this invention.
Figure 5B:
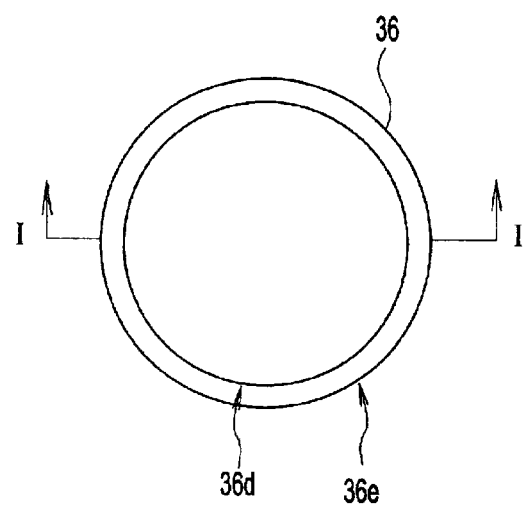
Figure 5C:
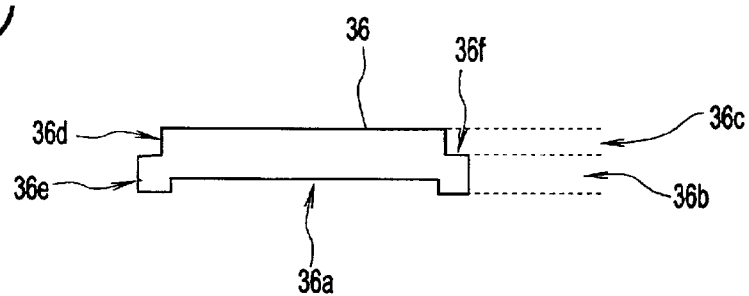
Figure 6:
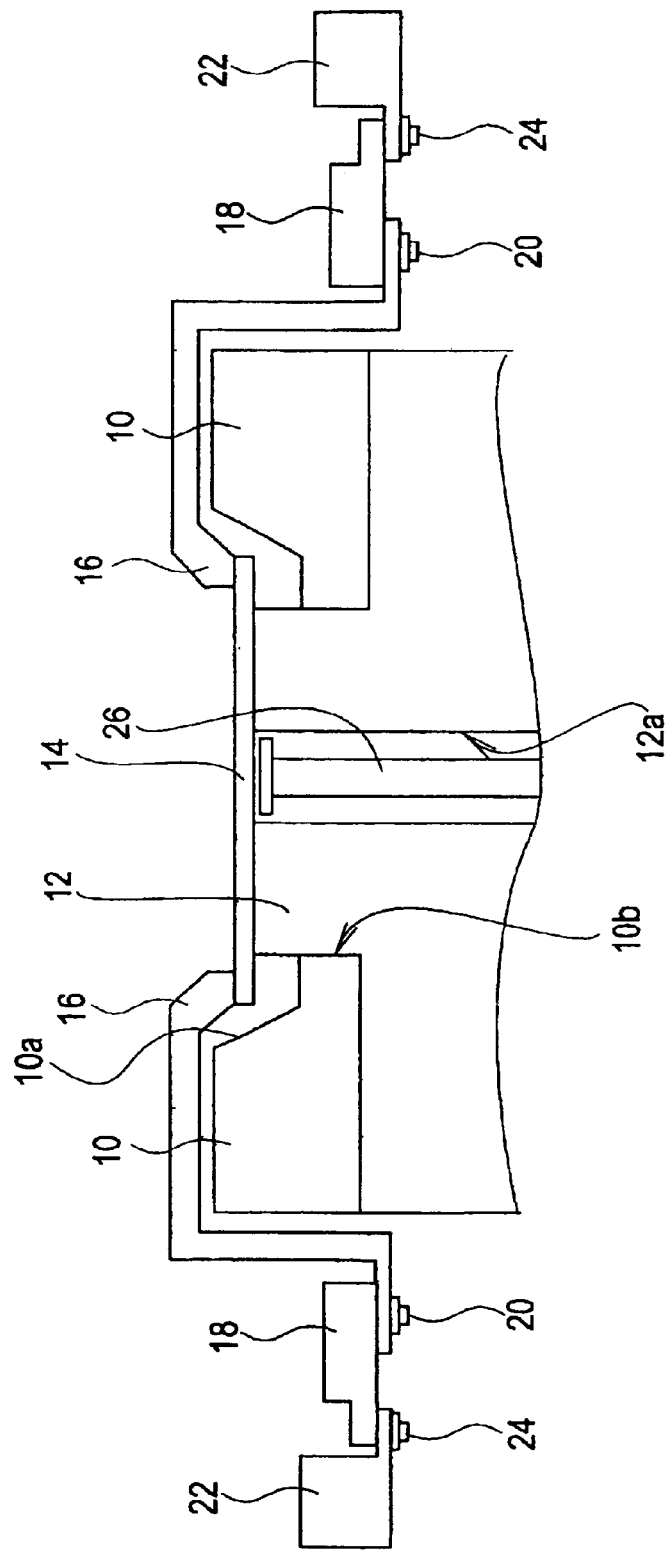
FIG. 6 is a diagram for showing the structure inside a conventional etching chamber.
Figure 7:
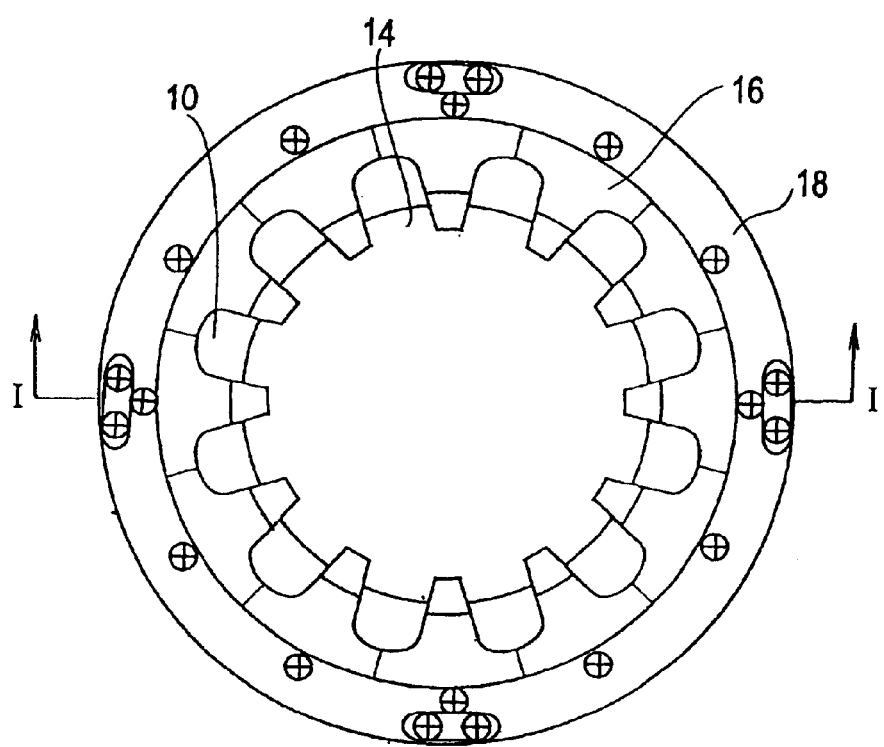
FIG. 7 is a plan view of the structure of the conventional etching chamber shown in FIG. 6.
Figure 8:
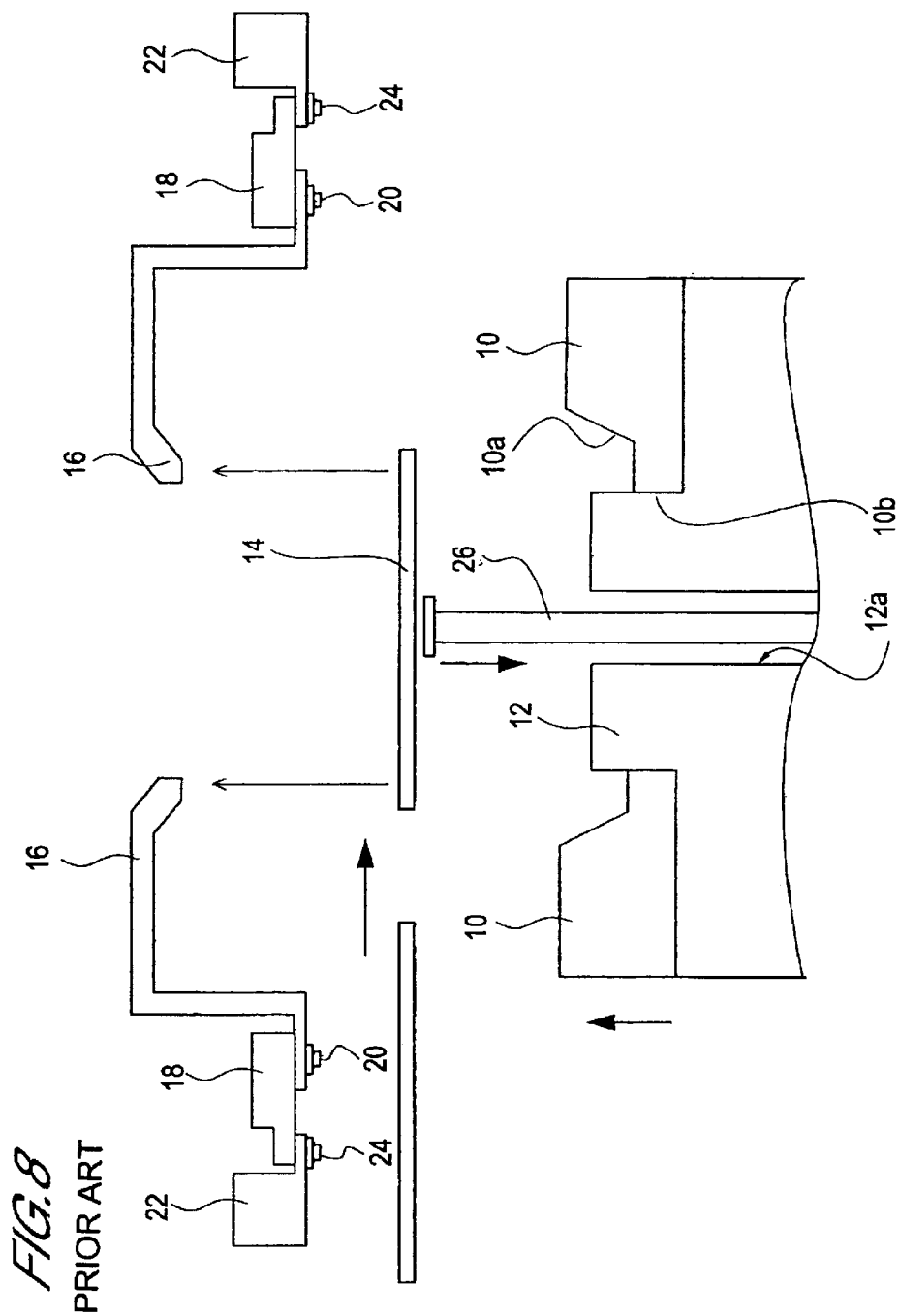
FIG. 8 is a diagram of the procedure for placing a wafer on the electrode.

FIG. 5 consists of diagrams of a structural example of the positioning jig in a fourth embodiment. The hatching indicating the cross sectional plane is omitted in these drawings. FIG. 5 (A) is a cross section of the inside of an etching chamber during the use of a positioning jig. FIG. 5(B) is a plan view of the positioning jig. FIG. 5(C) is a cross section along the I—I line in FIG. 5(B). The main structure inside the etching chamber shown in FIG. 5(A) is the same as that in FIG. 1. Structural elements such as the wafer vertical chuck 26 are omitted in FIG. 5(A), however.

A positioning jig 36 is a member consisting of two overlapping disk members (or cylinder members) with different diameters. Here, the disk member with the larger diameter is termed the lower structure 36b, while the disk member with the smaller diameter, which is connected over this lower structure 36b, is termed the upper structure 36c. A recess 36a is formed in the center on the opposite side of the lower structure 36b from the side where the upper structure 36c is located.

This member can be combined with the electrode (stage) 12 by fitting the top part of the electrode 12 into the above-mentioned recess 36a. The position of the lateral side of this member specifies the dispositional positions of the wafer clamps 16 in a state in which the recess 36a is fitted onto the electrode 12. As shown in FIG. 5(A), the wafer clamps 16 can be accurately and easily positioned by bringing the distal lateral sides and the distal bottom sides of the wafer clamps 16 into contact with this lateral side.

Specifically, the lateral side of this member comprises a first lateral side 36d (the lateral side of the upper structure 36c), a second lateral side 36e (the lateral side of the lower structure 36b), and a third lateral side 36f that connects the first and second lateral sides. The first and second lateral sides 36d and 36e are cylindrical sides parallel to each other. The second lateral side 36e is located further to the outside than the first lateral side 36d. The above-mentioned third lateral side 36f is a plane that connects the first and second lateral sides 36d and 36e and is perpendicular to the first and second lateral sides 36d and 36e. The first and second lateral sides 36d and 36e are parallel to the lateral side of the electrode 12 when this member is fitted to the top part of the electrode 12.

Thus, the first lateral side 36d of the upper structure 36c is a cylindrical side that is parallel to the lateral side of the electrode 12 when the recess 36a is fitted to the electrode 12. The side 36f of the lower structure 36b facing the upper structure 36c protrudes and extends to the outside of the lateral side 36d of the upper structure 36c, and is perpendicular to this lateral side 36d. Put another way, the lateral sides 36d and 36f of the member that face the upper structure 36c form a side that is L-shaped in the cross section of FIG. 5(C). The wafer clamps 16 can be positioned by bringing the distal ends of the wafer clamps 16 into contact with this side.

Therefore, when the holder to which the wafer clamps 16 are attached is attached to the seat, the above-mentioned positioning jig 36 is placed on the electrode 12, the distal lateral sides of the wafer clamps 16 are brought into contact with the lateral side 36d of the positioning jig 36, and the distal bottom sides of the wafer clamps 16 are brought into contact with the lateral side 36f of the positioning jig 36. The holder should be fixed to the seat in this state.

Thus, the jig in this embodiment allows the wafer clamps to be positioned not only in the main plane direction of the wafer, but also in the direction perpendicular to the main plane of the wafer. This jig allows the wafer clamps to be positioned easily and accurately, and cracking of the wafer can therefore be prevented.

What is claimed is:

1. A semiconductor manufacturing apparatus comprising:
a wafer support that has a tapered lateral side that supports an edge of a wafer from below said wafer;
a stage on which said wafer is placed;
wafer clamps that come into contact with a perimeter of said wafer from above said wafer;
a holder that accommodates said wafer clamps; and
a seat that accommodates said holder,
wherein male threads are formed at an outside surface of said holder and female threads that mesh with said male threads are formed at an inside surface of said seat.

2. The semiconductor manufacturing apparatus according to claim 1, wherein said wafer clamps push a perimeter of said wafer from above said wafer to adjust a lateral position of said wafer, while said wafer leans against the tapered lateral side of said wafer support so that a gap arises between an undersurface of said wafer and an upper surface of said stage, and to fix said wafer on said stage.

3. In a semiconductor manufacturing apparatus having a wafer support that has a tapered lateral side that supports an edge of a wafer from below said wafer; wafer clamps that come into contact with a perimeter of said wafer from above said wafer; and a stage that supports said wafer on an upper surface thereof,
a positioning jig, that is to be employed for positioning said wafer clamps, comprising:
a recess that fits onto said stage so as to cover said stage; and
a lateral side that, in a state in which said recess is fitted onto said stage, comes into contact with said wafer clamps, thereby specifying a position of said wafer clamps.

4. The positioning jig according to claim 3, wherein said lateral side is perpendicular to said upper surface of said stage when said recess is fitted onto said stage.

5. The positioning jig according to claim 3, wherein said positioning jig is of a cylindrical or prismatic shape that has said recess in a bottom side thereof.

6. The positioning jig according to claim 3, comprising:
an upper structure of a cylindrical or prismatic shape; and
a lower structure that has a cylindrical or prismatic shape and whose upper and bottom sides are wider than a bottom side of said upper structure;
wherein said recess is formed in the bottom side of said lower structure.

7. The semiconductor manufacturing apparatus according to claim 3, wherein said wafer clamps push a perimeter of said wafer from above said wafer to adjust a lateral position of said wafer, while said wafer leans against the tapered lateral side of said wafer support so that a gap arises between an undersurface of said wafer and an upper surface of said stage, and to fix said wafer on said stage.

8. A wafer-securing method comprising:
disposing a stage that has an upper surface on which a wafer is to be placed, and a wafer support that has a tapered lateral side that supports an edge of said wafer from below said wafer;
placing said wafer on said stage and determining a position at which said wafer is to be placed by said edge of said wafer coming into contact with said lateral side;
securing said wafer by using wafer clamps that come into contact with a perimeter of said wafer from above said wafer;
attaching said wafer clamps to an inside surface of a holder; and
attaching said holder to an inside surface of a seat,
wherein said holder has male threads formed in an outside surface thereof, and said seat has female threads formed in the inside surface thereof that mesh with said male threads.

9. The wafer-securing method according to claim 8, wherein during said securing, said wafer clamps push the perimeter of said wafer from above said wafer to adjust a lateral position of said wafer, while said wafer leans against the tapered lateral side of said wafer support so that a gap arises between an undersurface of said wafer and an upper surface of said stage, and to fix said wafer on said stage.

10. A wafer-securing method comprising:
disposing a stage that has an upper surface on which a wafer is to be placed, and a wafer support that has a tapered lateral side that supports an edge of said wafer from below said wafer;
placing said wafer on said stage and determining a position at which said wafer is to be placed by said edge of said wafer coming into contact with said lateral side;
securing said wafer by using wafer clamps that come into contact with a perimeter of said wafer from above said wafer;
fitting a positioning jig, that has a lateral side and a recess that is fittable onto said stage, onto said stage so as to cover said stage; and
positioning said wafer clamps by bringing said wafer clamps into contact with said lateral side of said jig.

11. The wafer-securing method according to claim 10, wherein said jig has a lateral side that is perpendicular to said upper surface of said stage when said recess is fitted onto said stage.

12. The wafer-securing method according to claim 10, wherein said jig has a cylindrical or prismatic shape that has said recess in a bottom side thereof.

13. The wafer-securing method according to claim 10, wherein said jig comprises:
an upper structure of a cylindrical or prismatic shape; and
a lower structure that has a cylindrical or prismatic shape and which has upper and bottom sides that are wider than a bottom side of said upper structure,
wherein said recess is formed in the bottom side of said lower structure.

* * * * *